(12) United States Patent
Kurokawa

(10) Patent No.: US 9,654,107 B2
(45) Date of Patent: May 16, 2017

(54) PROGRAMMABLE LSI

(71) Applicant: Semiconductor Energy Laboratory Co., Ltd., Atsugi-shi, Kanagawa-ken (JP)

(72) Inventor: Yoshiyuki Kurokawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 682 days.

(21) Appl. No.: 13/864,461

(22) Filed: Apr. 17, 2013

(65) Prior Publication Data

US 2013/0285697 A1 Oct. 31, 2013

(30) Foreign Application Priority Data

Apr. 27, 2012 (JP) ................... 2012-102014

(51) Int. Cl.
*H03K 19/177* (2006.01)
*H03K 19/00* (2006.01)

(52) U.S. Cl.
CPC ... *H03K 19/0013* (2013.01); *H03K 19/17784* (2013.01); *H03K 19/17792* (2013.01)

(58) Field of Classification Search
CPC ....... H03K 19/17796; H03K 19/17736; H03K 19/1776; H03K 19/177; H03K 19/17728; H03K 19/17748; H03K 19/17724; H03K 19/17776; H03K 19/018585;

(Continued)

(56) References Cited

U.S. PATENT DOCUMENTS

| 4,609,986 A | 9/1986 | Hartmann et al. |
| 4,642,487 A | 2/1987 | Carter |
| 4,870,302 A | 9/1989 | Freeman |

(Continued)

FOREIGN PATENT DOCUMENTS

| JP | 05-063551 A | 3/1993 |
| JP | 10-285014 A | 10/1998 |

(Continued)

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

(Continued)

*Primary Examiner* — Don Le
(74) *Attorney, Agent, or Firm* — Fish & Richardson P.C.

(57) ABSTRACT

An object is to achieve both suppression of operation delay and reduction in power consumption of a programmable LSI. A compiler generates, from source code, configuration data needed in a programmable LSI and a time schedule that shows a timing of using the data in the programmable LSI (a timing at which the data is held in a configuration memory) and a timing of storing the data in the programmable LSI before the data is used. Supply of new configuration data to the programmable LSI from the outside (storage of new configuration data) and data rewrite in the configuration memory in the programmable LSI (circuit reconfiguration) are performed independently and concurrently on the basis of the time schedule.

24 Claims, 9 Drawing Sheets

(58) Field of Classification Search
CPC ....... H03K 19/017581; H03K 19/0013; H03K 19/17784; H03K 19/17792; G06F 15/7867
USPC ................................................ 326/37–41, 47
See application file for complete search history.

(56) References Cited

U.S. PATENT DOCUMENTS

| | | | |
|---|---|---|---|
| 6,127,702 | A | 10/2000 | Yamazaki et al. |
| 6,172,521 | B1 | 1/2001 | Motomura |
| 6,842,386 | B2* | 1/2005 | Suzuki ........................ 365/200 |
| 7,674,650 | B2 | 3/2010 | Akimoto et al. |
| 7,728,626 | B2* | 6/2010 | Forbes et al. .................. 326/41 |
| 7,847,589 | B2 | 12/2010 | Kyouno et al. |
| 8,289,753 | B2 | 10/2012 | Yamazaki et al. |
| 8,359,448 | B1* | 1/2013 | Neuendorffer ............... 711/170 |
| 8,451,022 | B2 | 5/2013 | Kawano et al. |
| 8,542,032 | B1* | 9/2013 | Hutton et al. .................. 326/38 |
| 8,547,753 | B2 | 10/2013 | Takemura |
| 8,659,934 | B2 | 2/2014 | Yamazaki et al. |
| 8,811,067 | B2 | 8/2014 | Yamazaki et al. |
| 8,952,721 | B2 | 2/2015 | Ishiguro et al. |
| 9,214,209 | B2 | 12/2015 | Ishiguro et al. |
| 2002/0087846 | A1* | 7/2002 | Nickolls ............... G06F 9/3001 712/229 |
| 2006/0103420 | A1* | 5/2006 | Ciccarelli ........ H03K 19/17736 326/41 |
| 2006/0225139 | A1 | 10/2006 | Takada et al. |
| 2007/0011436 | A1* | 1/2007 | Bittner ................ G06F 12/0895 712/27 |
| 2007/0285979 | A1* | 12/2007 | Turner ......................... 365/174 |
| 2008/0024163 | A1 | 1/2008 | Marui |
| 2008/0079459 | A1 | 4/2008 | Kawano et al. |
| 2008/0148010 | A1* | 6/2008 | Kodama ........................ 712/16 |
| 2009/0146686 | A1* | 6/2009 | Voogel et al. .................. 326/38 |
| 2010/0148171 | A1 | 6/2010 | Hayashi et al. |
| 2010/0189166 | A1* | 7/2010 | Mori ............. 375/219 |
| 2010/0268862 | A1* | 10/2010 | Park .................... G06F 15/7867 711/101 |
| 2011/0110145 | A1* | 5/2011 | Yamazaki ............. G11C 11/405 365/149 |
| 2011/0175646 | A1 | 7/2011 | Takemura et al. |
| 2012/0089813 | A1* | 4/2012 | Jin ........................ G06F 9/3832 712/30 |
| 2012/0212995 | A1 | 8/2012 | Kurokawa |
| 2013/0207170 | A1 | 8/2013 | Kurokawa |
| 2013/0293263 | A1 | 11/2013 | Kurokawa |
| 2013/0321025 | A1 | 12/2013 | Kurokawa |
| 2014/0021980 | A1 | 1/2014 | Takemura et al. |
| 2014/0035616 | A1* | 2/2014 | Oda et al. ........................ 326/38 |
| 2014/0252346 | A1 | 9/2014 | Takemura et al. |
| 2015/0100771 | A1* | 4/2015 | Manchineni .......... G06F 9/4401 713/100 |
| 2015/0127935 | A1* | 5/2015 | Choi ................... G06F 9/44505 713/100 |
| 2015/0280740 | A1* | 10/2015 | Cho ....................... H03M 7/60 341/106 |

FOREIGN PATENT DOCUMENTS

| | | |
|---|---|---|
| JP | 3106998 B2 | 11/2000 |
| JP | 2006-287675 A | 10/2006 |
| JP | 2007-251329 A | 9/2007 |
| JP | 2008-090360 A | 4/2008 |
| JP | 2008-152409 A | 7/2008 |
| JP | 2011-119713 A | 6/2011 |
| JP | 2011-172214 A | 9/2011 |
| WO | WO-2008/152697 | 12/2008 |
| WO | WO-2011/055669 | 5/2011 |
| WO | WO-2011/089808 | 7/2011 |
| WO | WO-2011/162116 | 12/2011 |

OTHER PUBLICATIONS

T. Naito et al.; "World's first monolithic 3D-FPGA with TFT SRAM over 90nm 9 layer Cu CMOS"; 2010 Symposium on VLSI Technology : Digest of Technical Papers; Jun. 15, 2010; pp. 219-220.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931.

Y. Yanagawa et al.; "In-substrate-bitline Sense Amplifier with Array-noise-gating Scheme for Low-noise 4F2 DRAM Array Operable at 10-fF Cell Capacitance"; 2011 Symposium on VLSI Circuits Digest of Technical Papers; Jun. 15, 2011; pp. 230-231; IEEE.

* cited by examiner

PROGRAMMABLE LSI

BACKGROUND OF THE INVENTION

1. Field of the Invention

The present invention relates to a programmable LSI and a semiconductor device including the programmable LSI. Note that a semiconductor device in this specification indicates any device that can operate by utilizing semiconductor characteristics. For example, electro-optical devices, semiconductor circuits, and electronic devices are all included in the category of the semiconductor device.

2. Description of the Related Art

Programmable LSIs, which are reconfigurable, have advantages such as reduction in development period and flexibility in changing design specification, as compared to a conventional application specific integrated circuit (ASIC) and gate array, and have been widely used in semiconductor devices.

Specifically, a programmable LSI has a memory (configuration memory) that holds data (configuration data) for setting a circuit configuration. The circuit configuration is determined on the basis of the data held in the memory. Thus, the circuit can be reconfigured by rewrite of configuration data held in the configuration memory. Methods for reconfiguring a circuit are broadly classified into two types.

The first method is a static reconfiguration method in which a circuit is reconfigured while the operation of a programmable LSI stops. For example, a circuit can be reconfigured by rewrite of data in a configuration memory with configuration data input from the outside while the operation of the programmable LSI stops.

In static reconfiguration, the operation of the programmable LSI delays inevitably. Note that when data in a configuration memory is rewritten with configuration data input from the outside, it is difficult to continue the operation of the programmable LSI. This is due to design difficulty in sufficiently widening the width of a bus through which data is supplied to the programmable LSI from the outside (difficulty in sufficiently shortening a time necessary for rewriting data in the configuration memory).

The second method is a dynamic reconfiguration method in which a circuit is reconfigured while a programmable LSI continues operating (i.e., when a period during which the operation of the programmable LSI stops is extremely short). For example, a programmable LSI disclosed in Patent Document 1 achieves dynamic reconfiguration by including a dynamic random access memory (DRAM) other than a configuration memory. Specifically, a circuit is reconfigured in such a manner that data held in the configuration memory is replaced with one of plural pieces of configuration data that have been stored in the DRAM in advance (i.e., a circuit is reconfigured by rewrite of configuration data).

In the programmable LSI disclosed in Patent Document 1, operation delay can be suppressed. However, power consumption of the programmable LSI is inevitably increased because plural pieces of configuration data need to be stored in the DRAM in advance and because refresh operations are required at regular intervals in order to hold the configuration data. In addition, static reconfiguration has to be performed when configuration data other than the configuration data stored in the DRAM is necessary. If all pieces of configuration data that may be necessary are stored in a DRAM with the capacity of the DRAM being increased, there occur problems of further increase in power consumption and increase in circuit area.

REFERENCE

Patent Document 1: Japanese Published Patent Application No. H10-285014

SUMMARY OF THE INVENTION

In view of the foregoing, an object of one embodiment of the present invention is to achieve both suppression of operation delay and reduction in power consumption of a programmable LSI.

In one embodiment of the present invention, a compiler generates, from source code, configuration data needed in a programmable LSI and a time schedule that shows a timing of using the data in the programmable LSI (a timing at which the data is held in a configuration memory) and a timing of storing the data in the programmable LSI before the data is used. A feature of one embodiment of the present invention lies in that supply of new configuration data to the programmable LSI from the outside (storage of new configuration data) and data rewrite in the configuration memory in the programmable LSI (circuit reconfiguration) are performed independently and concurrently on the basis of the time schedule.

For example, one embodiment of the present invention is a programmable LSI having a logic circuit unit whose function can be modified on the basis of plural pieces of configuration data generated from source code by a compiler, and is characterized in that storage of the configuration data and reconfiguration of the logic circuit unit are performed independently and concurrently on the basis of a time schedule generated from the source code by the compiler.

In the programmable LSI of one embodiment of the present invention, based on the time schedule generated from the source code, storage of configuration data and reconfiguration of the logic circuit unit are performed independently and concurrently. Accordingly, storing configuration data needed for reconfiguration of the logic circuit unit in advance in the programmable LSI allows data in a configuration memory to be rewritten instantly. As a result, operation delay of the programmable LSI can be suppressed.

In addition, in the programmable LSI of one embodiment of the present invention, requisite configuration data is supplied from the outside as needed. That is, it is not necessary that many pieces of configuration data be stored in the programmable LSI all the time. Consequently, increase in power consumption and increase in circuit area of the programmable LSI can be suppressed.

In other words, in the programmable LSI of one embodiment of the present invention, both suppression of operation delay and reduction in power consumption can be achieved.

DETAILED DESCRIPTION OF THE INVENTION

Embodiments of the present invention will be described below in detail. Note that the present invention is not limited to the description below, and a variety of changes can be made without departing from the spirit and scope of the present invention. Therefore, the present invention should not be construed as being limited to the description below.

<Structural Example of Programmable LSI>

Figure 1A:
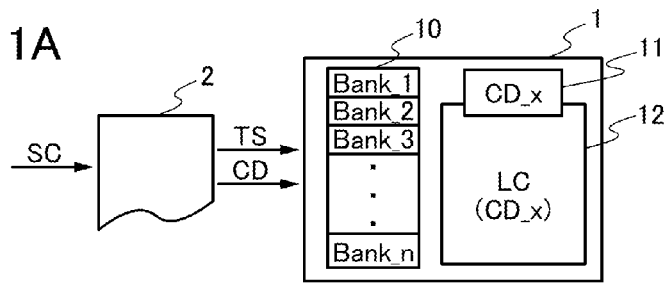
FIG. 1A illustrates an example of the structure of a programmable LSI.

FIG. 1A illustrates an example of the structure of a programmable LSI 1 in one embodiment of the present invention. The programmable LSI 1 includes a configuration memory 11 that can hold configuration data (CD_x), and a logic circuit unit 12 whose configuration (LC(CD_x)) is determined on the basis of the configuration data (CD_x) held in the configuration memory 11. The programmable LSI 1 also includes a plurality of banks (Bank_1 to Bank_n) each of which can store configuration data (CD) and which are collectively referred to as a bank group 10.

The programmable LSI 1 is supplied with configuration data (CD) and a time schedule (TS) that are generated from source code (SC) by a compiler 2. Note that the time schedule (TS) shows a timing of storing configuration data (CD) in the bank group 10 and a timing of rewriting existing configuration data (CD) held in the configuration memory 11 with one of plural pieces of configuration data (CD) stored in the bank group 10 (a timing of reconfiguring the logic circuit unit 12) in the programmable LSI 1. In other words, the time schedule (TS) shows a schedule for reconfiguration over time of the logic circuit unit 12 and a schedule for storing configuration data (CD) necessary for achieving the reconfiguration in the bank group 10.

Figure 1B:
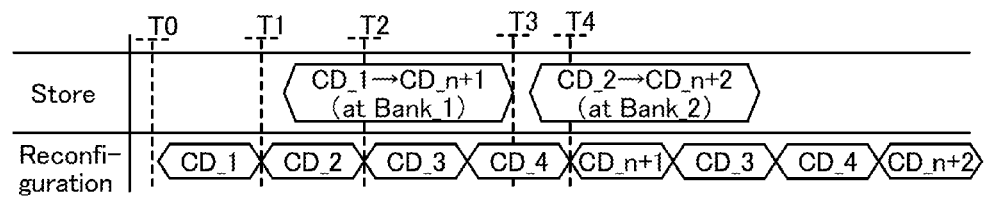
FIG. 1B illustrates an example of a timing chart, and FIGS. 1C to 1F each illustrate an example of a state of the programmable LSI.
Figure 1C:
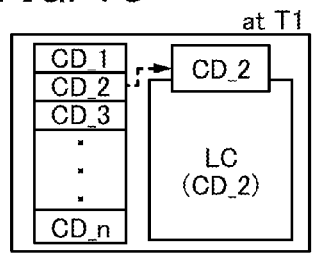
Figure 1D:
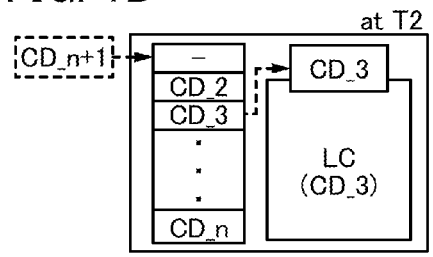
Figure 1E:
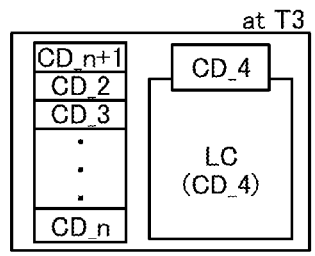
Figure 1F:
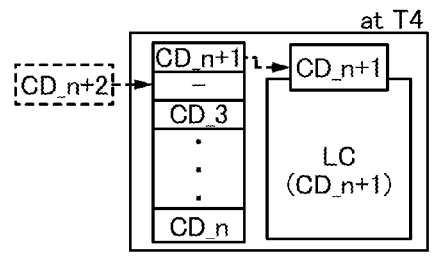

An example of the operation of the programmable LSI 1 will be described with reference to FIGS. 1B to 1F. FIG. 1B illustrates an example of the time schedule (TS) supplied to the programmable LSI 1. FIGS. 1C to 1F illustrate a state of the programmable LSI 1 at the respective timings (T1 to T4).

At the timing T0, the programmable LSI 1 is supplied with the time schedule (TS) after the timing T0 illustrated in FIG. 1B. At the timing T0, configuration data (CD_1 to CD_n) are stored in the plurality of banks (Bank_1 to Bank_n). Note that the following operation can be performed even when at least one of the plurality of banks (Bank_1 to Bank_n) does not store configuration data. That is, in the programmable LSI disclosed in this specification, it is not always necessary that all the plurality of banks (Bank_1 to Bank_n) store some sort of configuration data at all times.

At the timing T1, data in the configuration memory 11 is rewritten to change from configuration data (CD_1) to configuration data (CD_2) on the basis of the time schedule (TS). Accordingly, the logic circuit unit 12 is reconfigured so that its configuration changes from a configuration (LC (CD_1)) to a configuration (LC(CD_2)) (see FIG. 1C).

Then, the configuration memory 11 holds the configuration data (CD_2) until the timing T2. That is, the logic circuit unit 12 maintains the configuration (LC(CD_2)) until the timing T2. Further, based on the time schedule (TS), storage of configuration data (CD_n+1) in the bank (Bank_1) starts in a period between the timing T1 and the timing T2.

At the timing T2, the data in the configuration memory 11 is rewritten to change from the configuration data (CD_2) to configuration data (CD_3) on the basis of the time schedule (TS). Accordingly, the logic circuit unit 12 is reconfigured so that its configuration changes from the configuration (LC (CD_2)) to a configuration (LC(CD_3)). In addition, at the timing T2, the bank (Bank_1) continues to store the configuration data (CD_n+1) (see FIG. 1D).

At the timing T3, storage of the configuration data (CD_n+1) in the bank (Bank_1) is finished. Note that at the timing T3, the configuration memory 11 holds configuration data (CD_4). That is, the logic circuit unit 12 maintains a configuration (LC(CD_4)) (see FIG. 1E).

Then, based on the time schedule (TS), storage of configuration data (CD_n+2) in the bank (Bank_2) starts in a period between the timing T3 and the timing T4.

At the timing T4, the data in the configuration memory 11 is rewritten to change from the configuration data (CD_4) to the configuration data (CD_n+1) on the basis of the time schedule (TS). Accordingly, the logic circuit unit 12 is reconfigured so that its configuration changes from the configuration (LC(CD_4)) to a configuration (LC(CD_n+ 1)). In addition, at the timing T4, the bank (Bank_2) continues to store the configuration data (CD_n+2) (see FIG. 1F).

The above is an example of the operation of the programmable LSI illustrated in FIG. 1A.

In the programmable LSI 1, based on the time schedule (TS), it is possible to perform supply of new configuration data (CD) to the programmable LSI 1 from the outside (storage of new configuration data (CD)) and data rewrite in the configuration memory in the programmable LSI 1 (circuit reconfiguration) independently and concurrently.

Accordingly, requisite configuration data (CD) can be supplied to the bank group 10 from the outside as needed, and data in the configuration memory can be rewritten instantly. As a result, in the programmable LSI 1, both suppression of operation delay and reduction in power consumption can be achieved.

<Structural Example of Bank Group 10>

Figure 2A:
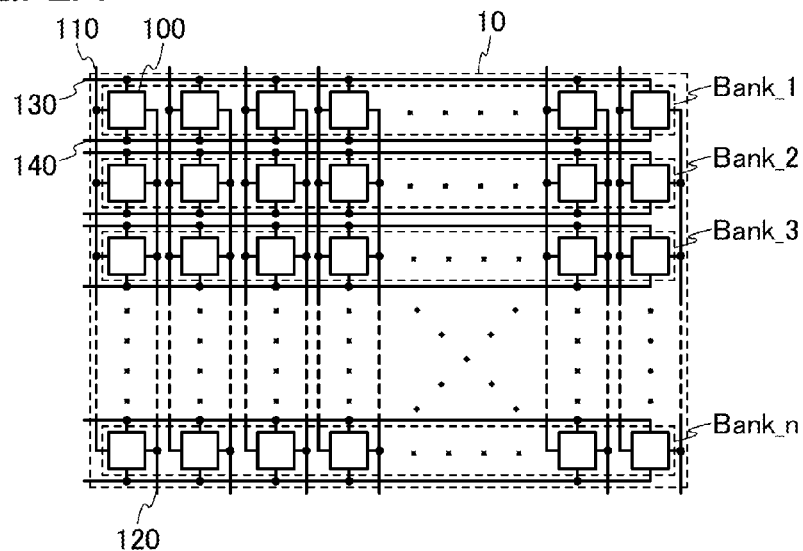
FIG. 2A illustrates an example of the structure of a bank group, and FIGS. 2B to 2E each illustrate an example of the structure of a memory cell.

FIG. 2A illustrates an example of the structure of the bank group 10 illustrated in FIG. 1A. The bank group 10 illustrated in FIG. 2A includes a plurality of memory cells 100 arranged in a matrix; a plurality of input bit lines 110 each of which is electrically connected to all memory cells 100 in a corresponding one column; a plurality of output bit lines 120 each of which is electrically connected to all memory cells 100 in a corresponding one column; a plurality of input word lines 130 each of which is electrically connected to all memory cells 100 in a corresponding one row; and a plurality of output word lines 140 each of which is electrically connected to all memory cells 100 in a corresponding one row.

Each of the plurality of banks (Bank_1 to Bank_n) is composed of a plurality of memory cells 100 in a corresponding one row. That is, the input bit line 110 and the output bit line 120 are electrically connected to one of the plurality of memory cells 100 included in each of the plurality of banks (Bank_1 to Bank_n). The input word line 130 and the output word line 140 are electrically connected to all the memory cells 100 included in one of the plurality of banks (Bank_1 to Bank_n).

In the bank group 10 illustrated in FIG. 2A, all the plurality of input bit lines 110 constitute an input bus, and all the plurality of output bit lines 120 constitute an output bus.

In the bank group 10 illustrated in FIG. 2A, when a selection signal is supplied to one of the plurality of input word lines 130, new configuration data is stored in a bank including the plurality of memory cells 100 electrically connected to the input word line 130; when a non-selection signal is supplied to the input word line 130, the configuration data stored in the bank is maintained.

Moreover, in the bank group 10 illustrated in FIG. 2A, when a selection signal is supplied to one of the plurality of output word lines 140, existing data in the configuration memory is replaced with configuration data stored in a bank including the plurality of memory cells 100 electrically connected to the output word line 140; when a non-selection signal is supplied to the output word line 140, existing data in the configuration memory is not replaced with the configuration data stored in the bank.

Consequently, as illustrated in FIG. 2A, storage of configuration data (CD) in one of the plurality of banks (Bank_1 to Bank_n) and rewrite of data in the configuration memory with configuration data stored in one of the plurality of banks other than the above bank (i.e., one of (n-1) banks) can be performed independently and concurrently in the bank group 10.

<Configuration Examples of Memory Cell 100>

FIGS. 2B to 2E are circuit diagrams each illustrating an example of the structure of the memory cell 100 illustrated in FIG. 2A.

Figure 2B:
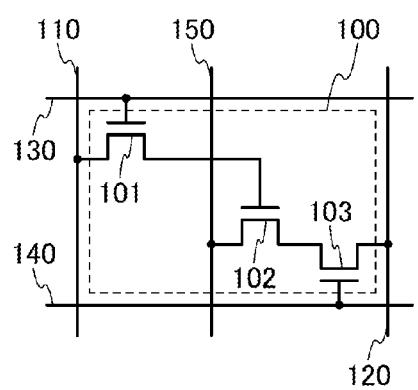

The memory cell 100 illustrated in FIG. 2B includes a transistor 101, a transistor 102, and a transistor 103. A gate of the transistor 101 is electrically connected to the input word line 130. One of a source and a drain of the transistor 101 is electrically connected to the input bit line 110. A gate of the transistor 102 is electrically connected to the other of the source and the drain of the transistor 101. One of a source and a drain of the transistor 102 is electrically connected to a reference potential line 150. A gate of the transistor 103 is electrically connected to the output word line 140. One of a source and a drain of the transistor 103 is electrically connected to the other of the source and the drain of the transistor 102. The other of the source and the drain of the transistor 103 is electrically connected to the output bit line 120.

The input word line 130 is supplied with a potential for turning on the transistor 101 as a selection signal, and supplied with a potential for turning off the transistor 101 as a non-selection signal. The output word line 140 is supplied with a potential for turning on the transistor 103 as a selection signal, and supplied with a potential for turning off the transistor 103 as a non-selection signal. The reference potential line 150 is supplied with a specific fixed potential.

In the memory cell 100 illustrated in FIG. 2B, 1-bit data can be stored at a node where the other of the source and the drain of the transistor 101 and the gate of the transistor 102 are electrically connected to each other. The stored data can be detected by judging the state (on/off state) of the transistor 102. Examples of a method of detecting the data are a method in which the potential of the output bit line 120 is detected while a voltage divider is constituted using the transistor 102 and the output bit line 120, and a method in which a predetermined potential is applied to the output bit line 120 in advance to detect whether the potential of the output bit line 120 is changed or not.

Note that here, the memory cell 100 is described as a memory cell that can store 1-bit (binary) data; alternatively, the memory cell 100 can be a memory cell that can store multi-bit (multi-level) data.

Figure 2C:
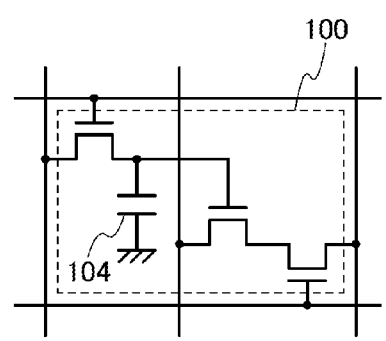

As illustrated in FIG. 2C, a capacitor 104 can be added to the memory cell 100 in FIG. 2B so that one electrode of the capacitor 104 is electrically connected to the other of the source and the drain of the transistor 101 and the other electrode of the capacitor 104 is grounded. This structure can improve the data retention of the memory cell 100.

Figure 2D:
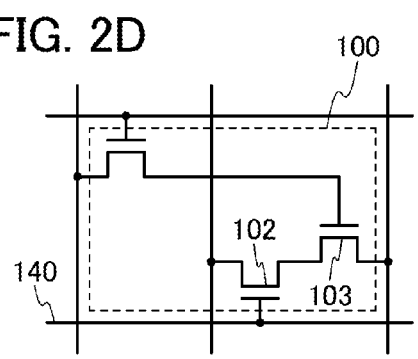

As illustrated in FIG. 2D, the component to which the gate of the transistor 102 is connected and the component to which the gate of the transistor 103 is connected in the memory cell 100 in FIG. 2B can interchange each other. In this case, the output word line 140 is supplied with a potential for turning on the transistor 102 when data in the configuration memory is rewritten with configuration data stored in the bank including the memory cell 100, and is supplied with a potential for turning off the transistor 102 in the other periods.

Figure 2E:
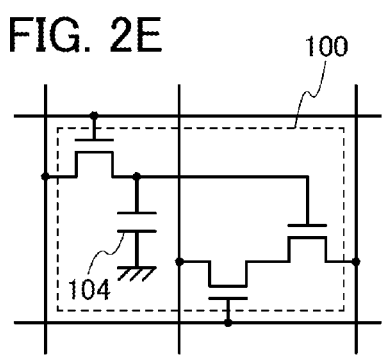

As illustrated in FIG. 2E, the capacitor 104 can be added to the memory cell 100 in FIG. 2D.

The transistor 101 is preferably a transistor in which a channel is formed in an oxide semiconductor layer. The off-state current of the transistor in which a channel is formed in an oxide semiconductor layer is extremely low. For this reason, the use of the transistor in which a channel is formed in an oxide semiconductor layer as the transistor 101 improves the data retention of the memory cell 100 and easily allows the memory cell 100 to store multi-bit (multi-level) data.

When the transistors 102 and 103 as well as the transistor 101 are transistors in which a channel is formed in an oxide semiconductor layer, the transistors 101 to 103 can be fabricated through the same process. When the transistors 102 and 103 are transistors with higher mobility than a transistor in which a channel is formed in an oxide semiconductor layer (e.g., when the transistors 102 and 103 are transistors in which a channel is formed in a crystalline silicon layer or a compound semiconductor layer), the speed of rewriting data in the configuration memory can be increased.

<Structural Example of Memory Cell 100>

The description is made on an example of the structure of the memory cell 100, and specifically examples of the structures and a fabrication method of the transistors 101 and 102 and the capacitor 104 illustrated in FIG. 2C. In the following description, the transistor 101 is a transistor in which a channel is formed in an oxide semiconductor layer, and the transistor 102 is a transistor in which a channel is formed in a single crystal silicon layer. Note that the transistor 103 in FIG. 2C can be fabricated in a manner similar to that of the transistor 102.

Figure 3A:
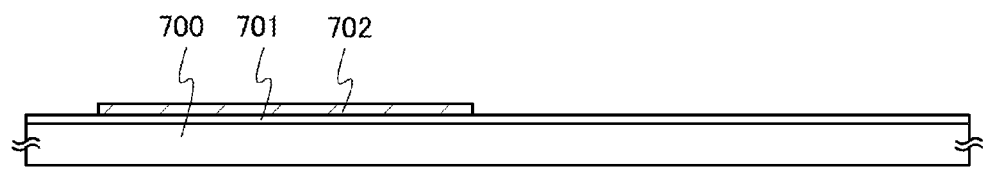
FIGS. 3A to 3C are cross-sectional views illustrating an example of the structure of a memory cell.

First, as illustrated in FIG. 3A, an insulating film 701 and a semiconductor film 702 that has been separated from a single crystal semiconductor substrate are formed over a substrate 700.

Although there is no particular limitation on a material that can be used for the substrate 700, the material needs to have at least heat resistance high enough to withstand heat treatment to be performed later. For example, the substrate 700 can be a glass substrate formed by a fusion process or a float process, a quartz substrate, a semiconductor substrate, or a ceramic substrate. In the case where a glass substrate is used and the temperature of the heat treatment performed later is high, a glass substrate with a strain point of 730° C. or higher is preferably used.

A method for fabricating the transistor 102 in which the semiconductor film 702 is formed using single crystal silicon will be described below. Note that a specific example of a method of forming a single crystal semiconductor film is briefly described. First, an ion beam including ions that are accelerated by an electric field enters a bond substrate that is a single crystal semiconductor substrate, and a fragile layer that is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 provided with the insulating film 701 are attached to each other so that the insulating film 701 is sandwiched therebetween. After the bond substrate and the substrate 700 overlap each other, a pressure of about 1 N/cm$^2$ to 500 N/cm$^2$, preferably about 11 N/cm$^2$ to 20 N/cm$^2$ is applied to part of the bond substrate and part of the substrate 700 so that the substrates are attached to each other. When the pressure is applied, bonding between the bond substrate and the insulating film 701 starts from the parts, which results in bonding of the entire surface where the bond substrate and the insulating film 701 are in close contact with each other. Subsequently, heat treatment is performed, whereby very small voids that exist in the fragile layer are combined, and the very small voids increase in volume as a result. Thus, a single crystal semiconductor film which is part of the bond substrate is separated from the bond substrate along the fragile layer. The heat treatment is performed at a temperature not exceeding the strain point of the substrate 700. Then, the single crystal semiconductor film is processed into a desired shape by etching or the like, so that the semiconductor film can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched to have a predetermined shape or may be added to the semiconductor film 702 which has been etched to have a predetermined shape. Alternatively, the impurity element for controlling the threshold voltage may be added to the bond substrate. Further alternatively, it is possible that the impurity element is added to the bond substrate in order to roughly control the threshold voltage, and the impurity element is also added to the semiconductor film which is not etched to have a predetermined shape or the semiconductor film 702 which has been etched to have a predetermined shape in order to finely control the threshold voltage.

Although an example of using a single crystal semiconductor film is described here, a polycrystalline, microcrystalline, or amorphous semiconductor film that is formed over the insulating film 701 by vapor deposition may be used. Alternatively, the semiconductor film may be crystallized by a known technique. Examples of the known technique of crystallization are a laser crystallization method using a laser beam and a crystallization method using a catalytic element. Alternatively, a crystallization method using a catalytic element and a laser crystallization method may be used in combination. In the case of using a heat-resistant substrate such as a quartz substrate, it is possible to combine any of the following crystallization methods: a thermal crystallization method using an electrically heated oven, a lamp heating crystallization method using infrared light, a crystallization method using a catalytic element, and a high-temperature heating method at approximately 950° C.

Figure 3B:
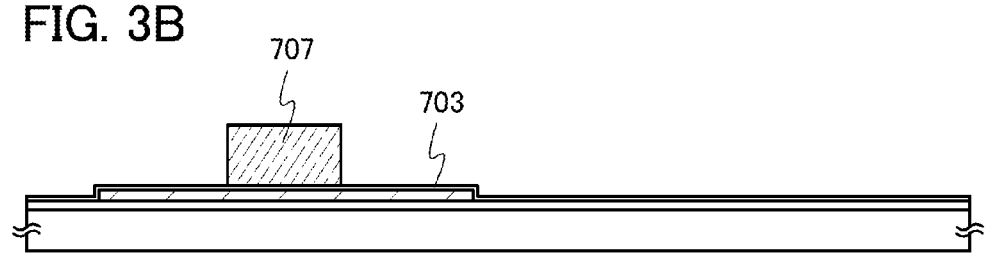

Next, as illustrated in FIG. 3B, a gate insulating film 703 is formed over the semiconductor film 702. The gate insulating film 703 can be a single layer or a stack of layers containing silicon oxide, silicon nitride oxide, silicon oxynitride, silicon nitride, hafnium oxide, aluminum oxide, tantalum oxide, yttrium oxide, hafnium silicate (HfSi$_x$O$_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, or the like formed by plasma CVD or sputtering, for example.

In this specification, oxynitride refers to a material containing a higher quantity of oxygen than that of nitrogen, and nitride oxide refers to a material containing a higher quantity of nitrogen than that of oxygen.

Alternatively, the gate insulating film 703 can be formed by oxidation or nitridation of a surface of the semiconductor film 702 by high-density plasma treatment, heat treatment, or the like. The high-density plasma treatment can be performed using, for example, a mixed gas of a rare gas such as He, Ar, Kr, or Xe and a gas such as oxygen, nitrogen oxide, ammonia, nitrogen, or hydrogen. In this case, by exciting plasma by introduction of microwaves, plasma with low electron temperature and high density can be generated. By oxidation or nitridation of the surface of the semiconductor film with oxygen radicals (including OH radicals in some cases) or nitrogen radicals (including NH radicals in some cases) generated by such high-density plasma, an insulating film with a thickness of 1 nm to 20 nm, preferably 5 nm to 10 nm can be formed to be in contact with the semiconductor film. For example, nitrous oxide (N$_2$O) is diluted with Ar by 1 to 3 times (flow rate) and a microwave (2.45 GHz) electric power of 3 kW to 5 kW is applied with a pressure of 10 Pa to 30 Pa so that the surface of the semiconductor film 702 is oxidized or nitrided. By this treatment, an insulating film with a thickness of 1 nm to 10 nm (preferably 2 nm to 6 nm) is formed. Further, nitrous oxide (N$_2$O) and silane (SiH$_4$) are introduced and a microwave (2.45 GHz) electric power of 3 kW to 5 kW is applied with a pressure of 10 Pa to 30 Pa so that a silicon oxynitride film is formed by vapor deposition to form the gate insulating film. With a combination of a solid-phase reaction and a reaction by vapor deposition, the gate insulating film with low interface state density and excellent withstand voltage can be formed.

The oxidation or nitridation of the semiconductor film by the high-density plasma treatment proceeds by solid-phase reaction. Thus, the interface state density between the gate insulating film 703 and the semiconductor film 702 can be extremely low. Further, by direct oxidation or nitridation of the semiconductor film 702 by high-density plasma treatment, variation in the thickness of the insulating film to be formed can be suppressed. In the case where the semiconductor film has crystallinity, by oxidation of the surface of the semiconductor film by solid-phase reaction by high-density plasma treatment, crystal grain boundaries can be prevented from being locally oxidized at high speed; thus, a uniform gate insulating film with low interface state density can be formed. A transistor in which the insulating film formed by the high-density plasma treatment is used as part or the whole of the gate insulating film can have less variation in characteristics.

The thickness of the gate insulating film 703 can be, for example, 1 nm to 100 nm, preferably 10 nm to 50 nm. Here, a single-layer insulating film containing silicon oxide is formed as the gate insulating film 703 by plasma CVD.

Then, a gate electrode 707 is formed as illustrated in FIG. 3B.

To form the gate electrode 707, a conductive film is formed and then is processed into a predetermined shape. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing any of the aforementioned metals as its main component or a compound containing any of the aforementioned metals may be used. Alternatively, the conductive film may be formed using a semiconductor such as polycrystalline silicon doped with an impurity element that imparts n-type conductivity to the semiconductor film, such as phosphorus.

Here, the gate electrode 707 is a single-layer conductive film, or alternatively may be a stack of a plurality of conductive films.

As a combination of two conductive films, tantalum nitride or tantalum can be used for a first conductive film and tungsten can be used for a second conductive film. Other examples of the combination are tungsten nitride and tungsten, molybdenum nitride and molybdenum, aluminum and tantalum, and aluminum and titanium. Since tungsten and tantalum nitride have high heat resistance, heat treatment aimed at thermal activation can be performed in subsequent steps after forming the two conductive films. Moreover, as the combination of the two conductive films, it is possible to use, for example, nickel silicide and silicon doped with an impurity element imparting n-type conductivity, or tungsten silicide and silicon doped with an impurity element imparting n-type conductivity.

In the case of using a three-layer structure in which three conductive films are stacked, it is preferable to employ a stacked structure of a molybdenum film, an aluminum film, and a molybdenum film.

Further, a light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Note that the gate electrode 707 may be selectively formed by a droplet discharge method without using a mask. A droplet discharge method is a method for forming a predetermined pattern by discharge or ejection of a droplet containing a predetermined composition from an orifice, and includes an inkjet method in its category.

The gate electrode 707 can be formed in such a manner that a conductive film is formed and then is etched to have a desired tapered shape by inductively coupled plasma (ICP) etching with appropriate control of the etching conditions (e.g., the amount of electric power applied to a coil-shaped electrode layer, the amount of electric power applied to an electrode layer on the substrate side, and the electrode temperature on the substrate side). The taper angle and the like can be adjusted also by the shape of a mask. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 3C:
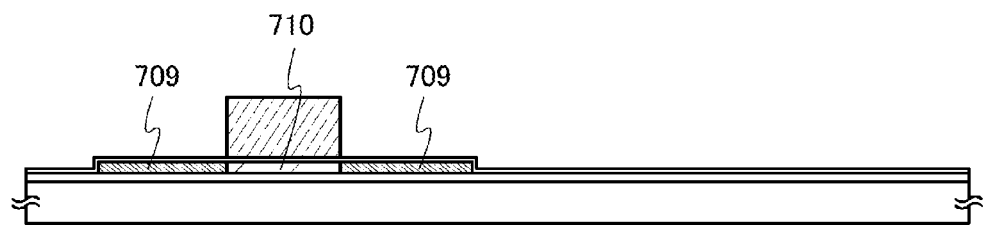

Next, as illustrated in FIG. 3C, by adding an impurity element imparting one conductivity to the semiconductor film 702 with the gate electrode 707 used as a mask, a channel formation region 710 over which the gate electrode 707 is positioned and a pair of impurity regions 709 between which the channel formation region 710 is placed are formed in the semiconductor film 702.

Here, the case where an impurity element imparting p-type conductivity (e.g., boron) is added to the semiconductor film 702 is described as an example.

Figure 4A:
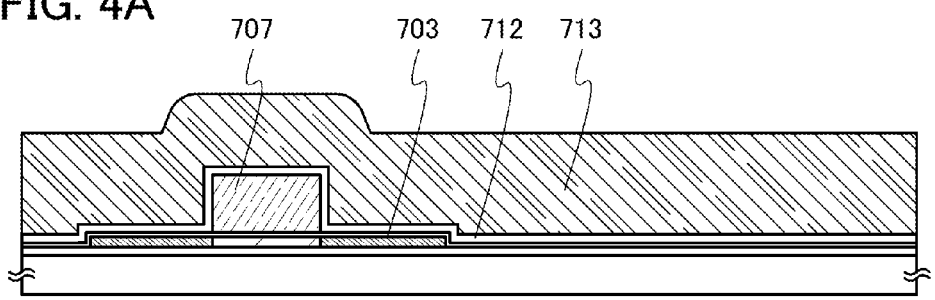
FIGS. 4A to 4C are cross-sectional views illustrating an example of the structure of a memory cell.

Then, as illustrated in FIG. 4A, insulating films 712 and 713 are formed to cover the gate insulating film 703 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material, in which case capacitance due to overlapping of electrodes or wirings can be sufficiently reduced. Note that a porous insulating film containing any of the above materials may be used as the insulating films 712 and 713. Since the porous insulating film has lower dielectric constant than a dense insulating film, parasitic capacitance due to electrodes or wirings can be further reduced.

Here, the case where silicon oxynitride is used for the insulating film 712 and silicon nitride oxide is used for the insulating film 713 is described as an example. In addition, the example in which the insulating films 712 and 713 are formed over the gate electrode 707 is described here; however, only one insulating film may be formed over the gate electrode 707 or a stack of three or more insulating films may be formed over the gate electrode 707.

Figure 4B:
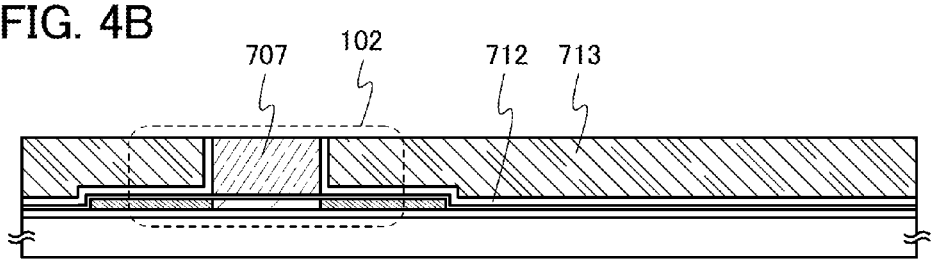

Next, as illustrated in FIG. 4B, the insulating films 712 and 713 are subjected to chemical mechanical polishing (CMP) treatment or etching, so that a surface of the gate electrode 707 is exposed. Note that in order to improve the characteristics of the transistor 101 formed later, surfaces of the insulating films 712 and 713 are preferably made as flat as possible.

Through the above process, the transistor 102 can be formed.

Figure 4C:
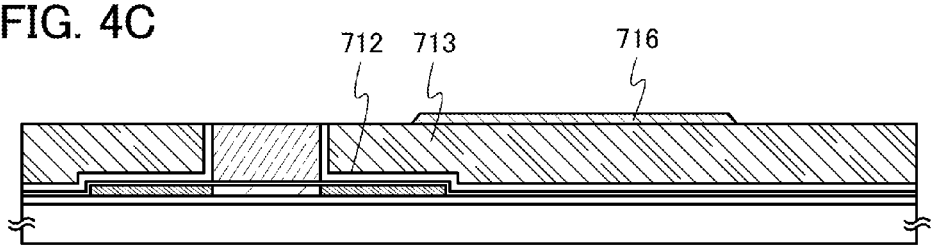

Next, a method for fabricating the transistor 101 is described. First, as illustrated in FIG. 4C, an oxide semiconductor layer 716 is formed over the insulating film 713.

The oxide semiconductor layer 716 can be formed by processing an oxide semiconductor film formed over the insulating film 713 into a desired shape. The thickness of the oxide semiconductor film is 2 nm to 200 nm, preferably 3 nm to 50 nm, more preferably 3 nm to 20 nm. The oxide semiconductor film is formed by sputtering using an oxide semiconductor as a target. Moreover, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust attached to the surfaces of the insulating films 712 and 713 is preferably removed by reverse sputtering in which an argon gas is introduced and plasma is generated. The reverse sputtering is a method in which voltage is applied to a substrate, not to a target side, under an argon atmosphere by using an RF power supply and plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

The oxide semiconductor layer preferably contains at least indium (In) or zinc (Zn). In particular, the oxide semiconductor layer preferably contains In and Zn. As a stabilizer for reducing variations in electric characteristics of transistors using the oxide semiconductor layer, the oxide semiconductor layer preferably contains gallium (Ga), tin (Sn), hafnium (Hf), and/or aluminum (Al) in addition to In and Zn. As another stabilizer, the oxide semiconductor layer may contain one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu). For example, it is possible to use any of the following oxides: indium oxide, tin oxide, and zinc oxide; In—Zn-based oxide, Sn—Zn-based oxide, Al—Zn-based oxide, Zn—Mg-based oxide, Sn—Mg-based oxide, In—Mg-based oxide, and In—Ga-based oxide which are oxides of two metal elements; In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide which are oxides of three metal elements; and In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide which are oxides of four metal elements.

For example, an In—Ga—Zn-based oxide semiconductor refers to an oxide semiconductor containing indium (In), gallium (Ga), and zinc (Zn), and there is no limitation on the composition thereof For the oxide semiconductor layer, a thin film represented by a chemical formula of $InMO_3(ZnO)_m$ (m>0, where m is not an integer) can be used. Here, M denotes one or more metal elements selected from Ga, Fe, Mn, and Co. Alternatively, as the oxide semiconductor, a material expressed by a chemical formula of $In_2SnO_5(ZnO)_n$ (n>0, where n is a natural number) may be used.

In the case where an In—Zn-based material is used as the oxide semiconductor, a target therefor has a composition of In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn-based oxide semiconductor with an atomic ratio of In:Zn:O=X:Y:Z, the relation of Z>1.5X+Y is satisfied.

Here, a 30-nm-thick In—Ga—Zn-based oxide semiconductor thin film that is obtained by sputtering using a target including indium (In), gallium (Ga), and zinc (Zn) is used as the oxide semiconductor film. A target with a metal composition ratio of In:Ga:Zn=1:1:0.5, 1:1:1, or 1:1:2 can be used as the target, for example. The filling rate of the target including In, Ga, and Zn is 90% or higher and 100% or lower, and preferably 95% or higher and lower than 100%. With the use of the target with high filling rate, a dense oxide semiconductor film is formed.

Here, the oxide semiconductor film is formed in such a manner that the substrate is held in the treatment chamber kept at reduced pressure, a sputtering gas from which hydrogen and moisture have been removed is introduced into the treatment chamber while moisture remaining in the chamber is removed, and the above-described target is used. The substrate temperature during the film formation may be 100° C. to 600° C., preferably 200° C. to 400° C. By forming the oxide semiconductor film while the substrate is heated, the concentration of impurities included in the formed oxide semiconductor film can be reduced. In addition, damage by sputtering can be reduced. In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$) (more preferably, also a compound containing a carbon atom), and the like are removed, whereby the impurity concentration in the oxide semiconductor film formed in the treatment chamber can be reduced.

As one example of the deposition conditions, the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that a pulsed direct current (DC) power supply is preferably used because dust generated in deposition can be reduced and the film thickness can be made uniform.

When the leakage rate of the treatment chamber of the sputtering apparatus is set to $1\times10^{-10}$ Pa·m$^3$/s or less, entry of impurities such as an alkali metal or hydride into the oxide semiconductor film that is being formed by sputtering can be reduced. Further, with the use of an entrapment vacuum pump as an exhaustion system, counter flow of impurities such as alkali metal, hydrogen atoms, hydrogen molecules, water, a hydroxyl group, or hydride from the exhaustion system can be reduced.

When the purity of the target is set to 99.99% or higher, alkali metal, hydrogen atoms, hydrogen molecules, water, a hydroxyl group, hydride, or the like mixed into the oxide semiconductor film can be reduced. In addition, when the above target is used, the concentration of alkali metal such as lithium, sodium, or potassium can be reduced in the oxide semiconductor film.

In order that the oxide semiconductor film contains as little hydrogen, a hydroxyl group, and moisture as possible, it is preferable that impurities such as moisture or hydrogen that are adsorbed on the substrate 700 be eliminated and exhausted by preheating of the substrate 700 over which the insulating films 712 and 713 are formed in a preheating chamber of a sputtering apparatus, as pretreatment for deposition. The temperature for the preheating is 100° C. to 400° C., preferably 150° C. to 300° C. As an evacuation unit provided in the preheating chamber, a cryopump is preferably used. Note that this preheating treatment can be omitted. The preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas used for dry etching, it is preferable to use a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, it is possible to use a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like.

As the dry etching method, a parallel plate RIE (reactive ion etching) method or an ICP (inductively coupled plasma) etching method can be used. In order to etch the film into a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. Here, ITO-07N (produced by Kanto Chemical Co., Inc.) is used.

A resist mask used for forming the oxide semiconductor layer 716 may be formed by an inkjet method. Formation of the resist mask by an inkjet method needs no photomask; thus, fabrication cost can be reduced.

Note that it is preferable that reverse sputtering is performed before the formation of a conductive film in a subsequent step so that a resist residue and the like that attach onto surfaces of the oxide semiconductor layer 716 and the insulating films 712 and 713 are removed.

Note that the oxide semiconductor film formed by sputtering or the like sometimes contains a large amount of moisture or hydrogen (including a hydroxyl group) as impurities. Moisture or hydrogen easily forms donor levels and thus serves as impurities in the oxide semiconductor. Therefore, in one embodiment of the present invention, in order to reduce impurities such as moisture and hydrogen in the oxide semiconductor film (dehydrate or dehydrogenate the oxide semiconductor film), the oxide semiconductor layer 716 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, further preferably 10 ppb or less, in the case where the measurement is performed by a dew point meter of a cavity ring down laser spectroscopy (CRDS) system).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

Here, an electric furnace which is one of heat treatment apparatuses is used.

Note that the heat treatment apparatus is not limited to an electric furnace, and may have a device for heating an object by heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, like nitrogen or a rare gas such as argon is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (i.e., the impurity concentration is preferably 1 ppm or lower, more preferably 0.1 ppm or lower).

Alkali metal is not a constituent element of an oxide semiconductor and is therefore an impurity. Alkaline earth metal also serves as an impurity in the case where alkaline earth metal is not a constituent element of an oxide semiconductor. When an insulating film in contact with the oxide semiconductor layer is an oxide, Na, among the alkali metals, diffuses into the insulating film and becomes $Na^+$. Further, in the oxide semiconductor layer, Na cuts or enters a bond between metal and oxygen which are included in the oxide semiconductor. As a result, the characteristics of the transistor deteriorate, for example, the transistor is placed in a normally-on state due to a negative shift of the threshold voltage or the mobility is decreased. In addition, the characteristics of transistors vary. Such deterioration of characteristics of the transistor and variations in characteristics due to the impurity are significant especially in the case where the hydrogen concentration of the oxide semiconductor layer is sufficiently low. Therefore, the concentration of the above impurity is preferably reduced when the hydrogen concentration of the oxide semiconductor layer is $1 \times 10^{18}/cm^3$ or lower, preferably $1 \times 10^{17}/cm^3$ or lower. Specifically, the measurement value of a Na concentration by secondary ion mass spectrometry is preferably $5 \times 10^{16}/cm^3$ or lower, further preferably $1 \times 10^{16}/cm^3$ or lower, still further preferably $1 \times 10^{15}/cm^3$ or lower. Similarly, the measurement value of a Li concentration is preferably $5 \times 10^{15}/cm^3$ or lower, further preferably $1 \times 10^{15}/cm^3$ or lower. Similarly, the measurement value of a K concentration is preferably $5 \times 10^{15}/cm^3$ or lower, further preferably $1 \times 10^{15}/cm^3$ or lower.

Through the above steps, the hydrogen concentration in the oxide semiconductor layer 716 can be reduced. In addition, heat treatment at a temperature lower than or equal to the glass transition temperature makes it possible to form an oxide semiconductor layer with extremely low carrier density and a wide band gap. Consequently, the transistor can be manufactured using a large-sized substrate, so that the productivity can be increased. The above heat treatment can be performed at any time after the oxide semiconductor film is formed.

Note that the oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal. Note that in most cases, a crystal part in the CAAC-OS film fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, the c-axis is aligned in a direction parallel to a normal vector of a surface where the CAAC-OS film is formed or a normal vector of a surface of the CAAC-OS film, triangular or hexagonal atomic arrangement is formed when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 85° to 95°. In addition, the term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is sometimes higher than that in the vicinity of the surface where the oxide semiconductor film is formed. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface over which the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

Note that part of oxygen included in the oxide semiconductor film may be substituted with nitrogen.

Figure 5A:
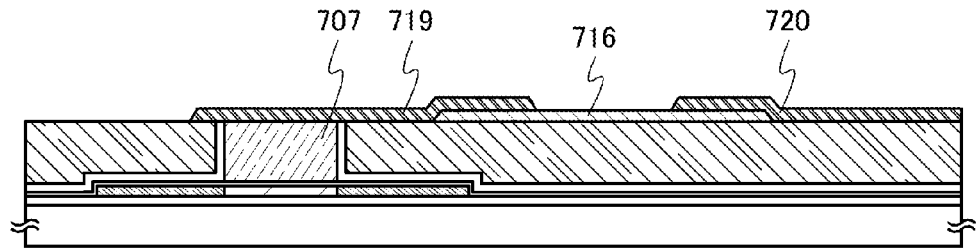
FIGS. 5A to 5C are cross-sectional views illustrating an example of the structure of a memory cell.

Next, as illustrated in FIG. 5A, the conductive film 719 that is in contact with the gate electrode 707 and the oxide semiconductor layer 716, and the conductive film 720 that is in contact with the oxide semiconductor layer 716 are formed. The conductive films 719 and 720 function as a source and drain electrodes.

Specifically, the conductive films 719 and 720 can be formed in such a manner that a conductive film is formed by sputtering or vacuum vapor deposition and then processed into a predetermined shape.

The conductive film to be the conductive films 719 and 720 can be formed using any of the following materials: an element selected from aluminum, chromium, copper, tantalum, titanium, molybdenum, and tungsten; an alloy containing any of these elements; an alloy containing the above elements in combination; and the like. Alternatively, the conductive film may have a structure in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film to be the conductive films 719 and 720 may have a single-layer structure or a stacked structure of two or more layers. For example, the conductive film may have a single-layer structure of an aluminum film containing silicon, a two-layer structure in which a titanium film is stacked over an aluminum film, or a three-layer structure in which a titanium film, an aluminum film, and a titanium film are stacked in this order. A Cu—Mg—Al alloy, a Mo—Ti alloy, Ti, and Mo have high adhesiveness with an oxide film; therefore, when the conductive films 719 and 720 have a stacked structure in which a conductive film of Cu is stacked over a conductive film of a Cu—Mg—Al alloy, a Mo—Ti alloy, Ti, or Mo, the adhesion between an insulating film which is an oxide film and the conductive films 719 and 720 can be increased.

For the conductive film to be the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that the materials and etching conditions are adjusted as appropriate so that the oxide semiconductor layer 716 is not removed as much as possible in etching of the conductive film. Depending on the etching conditions, an exposed portion of the oxide semiconductor layer 716 is partially etched and thus a groove (a recessed portion) is formed in some cases.

Here, a titanium film is used as the conductive film. Thus, wet etching can be selectively performed on the conductive film using a solution containing ammonia and hydrogen peroxide water (an ammonia hydrogen peroxide mixture). As the ammonia hydrogen peroxide mixture, a solution in which hydrogen peroxide water of 31 wt %, ammonia water of 28 wt %, and water are mixed at a volume ratio of 5:2:2 is specifically used. Alternatively, dry etching may be performed on the conductive film with the use of a gas containing chlorine ($Cl_2$), boron chloride ($BCl_3$), or the like.

In order to reduce the number of photomasks and steps in a photolithography step, etching may be performed with the use of a resist mask formed using a multi-tone mask through which light is transmitted so as to have a plurality of intensities. A resist mask formed using a multi-tone mask has a plurality of thicknesses and can be changed in shape by etching; thus, the resist mask can be used in a plurality of etching steps for processing films into different patterns. Thus, a resist mask corresponding to at least two kinds of different patterns can be formed by one multi-tone mask. As a result, the number of light-exposure masks can be reduced and the number of corresponding photolithography steps can also be reduced, whereby the process can be simplified.

Further, an oxide conductive film functioning as a source and drain regions may be provided between the oxide semiconductor layer 716 and the conductive films 719 and 720 functioning as the source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, zinc gallium oxide, or the like can be used.

For example, in the case where the oxide conductive film is formed, etching for forming the oxide conductive film and etching for forming the conductive films 719 and 720 may be performed concurrently.

By providing the oxide conductive film functioning as the source and drain regions, the resistance between the oxide semiconductor layer 716 and the conductive films 719 and 720 can be lowered, so that the transistor can operate at high speed. In addition, with provision of the oxide conductive film functioning as the source and drain regions, the withstand voltage of the transistor can be increased.

Next, plasma treatment may be performed using a gas such as $N_2O$, $N_2$, or Ar. By this plasma treatment, water or the like attached onto an exposed surface of the oxide semiconductor layer is removed. Plasma treatment may be performed using a mixture gas of oxygen and argon as well.

Figure 5B:
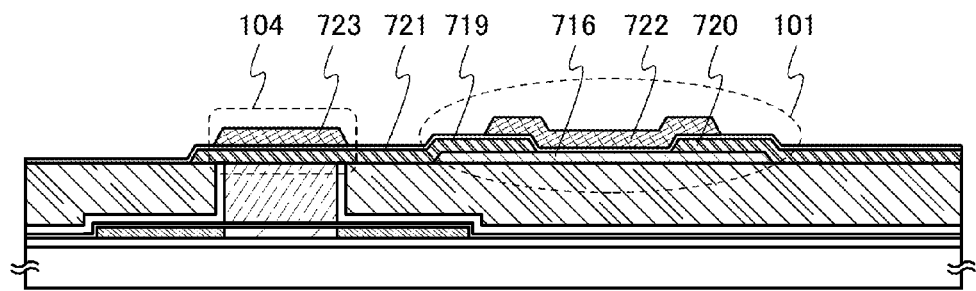

After the plasma treatment, as illustrated in FIG. 5B, the gate insulating film 721 is formed to cover the conductive films 719 and 720 and the oxide semiconductor layer 716. Then, a gate electrode 722 is formed over the gate insulating film 721 to overlap the oxide semiconductor layer 716, and a conductive film 723 is formed over the gate insulating film 721 to overlap the conductive film 719.

The gate insulating film 721 can be a single layer or a stack of layers containing silicon oxide, silicon nitride oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate (HfSi$_x$O$_y$ (x>0, y>0)) to which nitrogen is added, hafnium aluminate (HfAl$_x$O$_y$ (x>0, y>0)) to which nitrogen is added, gallium oxide, trimethylgallium, triethylgallium, or the like formed by plasma CVD, sputtering, or metal-organic chemical vapor deposition (MOCVD), for example.

Note that the gate insulating film 721 preferably includes impurities such as moisture or hydrogen as little as possible, and the gate insulating film 721 may be a single-layer insulating film or a plurality of insulating films stacked. If hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity) and a parasitic channel might be formed as a result. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, or an aluminum nitride oxide film can be used, for example. When a plurality of insulating films stacked are used, an insulating film having a lower proportion of nitrogen, such as a silicon oxide film or a silicon oxynitride film, is formed closer to the oxide semiconductor layer 716 than the insulating film having a high barrier property is. Then, the insulating film having a high barrier property is formed to overlap the conductive films 719 and 720 and the oxide semiconductor layer 716 with the insulating film having a lower proportion of nitrogen placed therebetween. With the use of the insulating film having a high barrier property, impurities such as moisture and hydrogen can be prevented from entering the oxide semiconductor layer 716, the gate insulating film 721, or the interface between the oxide semiconductor layer 716 and another insulating film and the vicinity thereof In addition, the insulating film having a lower proportion of nitrogen, such as a silicon oxide film or a silicon oxynitride film, formed in contact with the oxide semiconductor layer 716 can prevent the insulating film formed using a material having a high barrier property from being in direct contact with the oxide semiconductor layer 716.

Here, the gate insulating film 721 has a structure in which a 100-nm-thick silicon nitride film formed by sputtering is stacked over a 200-nm-thick silicon oxide film formed by sputtering. The substrate temperature during the film formation may range from room temperature to 300° C. and is 100° C. here.

After the gate insulating film 721 is formed, heat treatment may be performed. The heat treatment is performed in a nitrogen atmosphere, ultra-dry air, or a rare gas (e.g., argon or helium) atmosphere preferably at 200° C. to 400° C., and for example at 250° C. to 350° C. It is preferable that the water content in the gas be 20 ppm or less, preferably 1 ppm or less, further preferably 10 ppb or less. Here, for example, heat treatment is performed at 250° C. for 1 hour in a nitrogen atmosphere. Alternatively, RTA treatment for a short time at a high temperature may be performed before the formation of the conductive films 719 and 720 in a manner similar to that of the heat treatment performed on the oxide semiconductor layer for reduction of moisture or hydrogen. Even when oxygen vacancies are generated in the oxide semiconductor layer 716 by the previous heat treatment performed on the oxide semiconductor layer 716, oxygen is supplied to the oxide semiconductor layer 716 from the gate insulating film 721 by performing heat treatment after the gate insulating film 721 containing oxygen is provided. By the supply of oxygen to the oxide semiconductor layer 716, oxygen vacancies that serve as donors can be reduced in the oxide semiconductor layer 716 and the stoichiometric composition can be satisfied. It is preferable that the proportion of oxygen in the oxide semiconductor layer 716 be higher than that in the stoichiometric composition. As a result, the oxide semiconductor layer 716 can be made to be substantially i-type and variation in electrical characteristics of the transistor due to oxygen vacancies can be reduced; thus, electrical characteristics can be improved. There is no particular limitation on the timing of this heat treatment as long as it is after the formation of the gate insulating film 721. When this heat treatment doubles as another step such as heat treatment for formation of a resin film or heat treatment for reduction of the resistance of a transparent conductive film, the oxide semiconductor layer 716 can be made to be substantially i-type without increase in the number of steps.

Moreover, oxygen vacancies that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, further preferably 7N (99.99999%) or higher (i.e., the impurity concentration in the oxygen gas is preferably 1 ppm or lower, further preferably 0.1 ppm or lower).

Alternatively, oxygen may be added to the oxide semiconductor layer 716 by ion implantation, ion doping, or the like to reduce oxygen vacancies serving as donors. For example, oxygen that is made into a plasma state with a microwave at 2.45 GHz may be added to the oxide semiconductor layer 716.

The gate electrode 722 and the conductive film 723 can be formed in such a manner that a conductive film is formed over the gate insulating film 721 and then is processed by etching. The gate electrode 722 and the conductive film 723 can be formed using a material similar to that of the gate electrode 707 or the conductive films 719 and 720.

The thickness of each of the gate electrode 722 and the conductive film 723 is 10 nm to 400 nm, preferably 100 nm to 200 nm. Here, after a 150-nm-thick conductive film for the gate electrode is formed by sputtering using a tungsten target, the conductive film is processed into a desired shape by etching to form the gate electrode 722 and the conductive film 723. Note that a resist mask may be formed by an inkjet method. Formation of the resist mask by an inkjet method needs no photomask; thus, fabrication cost can be reduced.

Through the above process, the transistor 101 is formed.

Note that the transistor 101 is not limited to a transistor in which a channel is formed in an oxide semiconductor layer, and can be a transistor in which a channel formation region contains a semiconductor material having a wider band gap and lower intrinsic carrier density than silicon. Examples of such a semiconductor material include silicon carbide and gallium nitride other than an oxide semiconductor. With a channel formation region including such a semiconductor material, a transistor with extremely low off-state current can be obtained.

Note that a portion where the conductive film 719 and the conductive film 723 overlap each other with the gate insulating film 721 placed therebetween corresponds to the capacitor 104.

Although the transistor 101 is described as a single-gate transistor, it is possible, if necessary, to fabricate a multi-gate transistor that includes a plurality of gate electrodes electrically connected to each other and thus includes a plurality of channel formation regions.

Note that an insulating film is in contact with the oxide semiconductor layer 716 (which corresponds to the gate insulating film 721) may be formed using an insulating material containing an element that belongs to Group 13 and oxygen. Many of oxide semiconductor materials contain a Group 13 element, and an insulating material containing a Group 13 element is compatible with an oxide semiconductor. Thus, when an insulating material containing a Group 13 element is used for the insulating film in contact with the oxide semiconductor layer, the state of the interface between the oxide semiconductor layer and the insulating film can be kept favorable.

An insulating material containing a Group 13 element is an insulating material containing one or more elements that belong to Group 13 of the periodic table. Examples of the insulating material containing a Group 13 element are gallium oxide, aluminum oxide, aluminum gallium oxide, and gallium aluminum oxide. Here, aluminum gallium oxide refers to a material in which the aluminum content is higher than the gallium content in atomic percent, and gallium aluminum oxide refers to a material in which the gallium content is higher than or equal to the aluminum content in atomic percent.

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced.

Note that a similar effect can be obtained when an element in the same group as a constituent element of the oxide semiconductor is used in an insulating film. For example, it is effective to form an insulating film with the use of a material containing aluminum oxide. Note that water is less likely to permeate aluminum oxide, and it is therefore preferable to use a material containing aluminum oxide in terms of preventing entry of water to the oxide semiconductor layer.

The insulating film which is in contact with the oxide semiconductor layer 716 preferably contains oxygen in a proportion higher than the stoichiometric composition by heat treatment in an oxygen atmosphere, oxygen doping, or the like. Oxygen doping is addition of oxygen into a bulk. Note that the term "bulk" is used in order to clarify that oxygen is added not only to a surface of a thin film but also to the inside of the thin film. In addition, the term "oxygen doping" includes oxygen plasma doping in which oxygen that is made to be plasma is added to a bulk. The oxygen doping may be performed by ion implantation or ion doping.

For example, in the case where the insulating film in contact with the oxide semiconductor layer 716 is formed using gallium oxide, the composition of gallium oxide can be set to be $Ga_2O_x$ ($x=3+\alpha$, $0<\alpha<1$) by heat treatment in an oxygen atmosphere or by oxygen doping.

In the case where the insulating film in contact with the oxide semiconductor layer 716 is formed using aluminum oxide, the composition of aluminum oxide can be set to be $Al_2O_x$ ($x=3+\alpha$, $0<\alpha<1$) by heat treatment in an oxygen atmosphere or by oxygen doping.

In the case where the insulating film in contact with the oxide semiconductor layer 716 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping.

By oxygen doping, an insulating film that includes a region where the proportion of oxygen is higher than that in the stoichiometric composition can be formed. When the insulating film including such a region is in contact with the oxide semiconductor layer, excess oxygen in the insulating film is supplied to the oxide semiconductor layer, and oxygen defects in the oxide semiconductor layer or at the interface between the oxide semiconductor layer and the insulating film are reduced. Thus, the oxide semiconductor layer can be made to be an i-type or substantially i-type oxide semiconductor.

Note that the insulating film including a region where the proportion of oxygen is higher than that in the stoichiometric composition may be used as either the insulating film placed above the oxide semiconductor layer 716 or the insulating film placed below the oxide semiconductor layer 716 of the insulating films in contact with the oxide semiconductor layer 716; however, it is preferable to use such an insulating film as both of the insulating films in contact with the oxide semiconductor layer 716. The above-described effect can be enhanced with a structure where the insulating films including a region where the proportion of oxygen is higher than that in the stoichiometric composition are used as insulating films placed above and below the insulating films in contact with the oxide semiconductor layer 716 so that the oxide semiconductor layer 716 is sandwiched between the insulating films.

The insulating films placed above and below the oxide semiconductor layer 716 may contain the same constituent elements or different constituent elements. For example, both of the insulating films placed above and below the oxide semiconductor layer 716 may be formed using gallium oxide whose composition is $Ga_2O_x$ ($x=3+\alpha$, $0<\alpha<1$). Alternatively, one of these insulating films may be formed using gallium oxide whose composition is $Ga_2O_x$ ($x=3+\alpha$, $0<\alpha<1$) and the other may be formed using aluminum oxide whose composition is $Al_2O_x$ ($x=3+\alpha$, $0<\alpha<1$).

The insulating film in contact with the oxide semiconductor layer 716 may be a stack of insulating films each including a region where the proportion of oxygen is higher than that in the stoichiometric composition. For example, the insulating film placed above the oxide semiconductor layer 716 may be formed as follows: gallium oxide whose composition is $Ga_2O_x$ ($x=3+\alpha$, $0<\alpha<1$) is formed and gallium aluminum oxide (aluminum gallium oxide) whose composition is $Ga_xAl_{2-x}O_{3+\alpha}$ ($0<x<2$, $0<\alpha<1$) is formed thereover. Note that it is possible that the insulating film placed below the oxide semiconductor layer 716, or both of the insulating films placed above and below the oxide semiconductor layer 716 may be a stack of insulating films each including a region where the proportion of oxygen is higher than that in the stoichiometric composition.

Figure 5C:
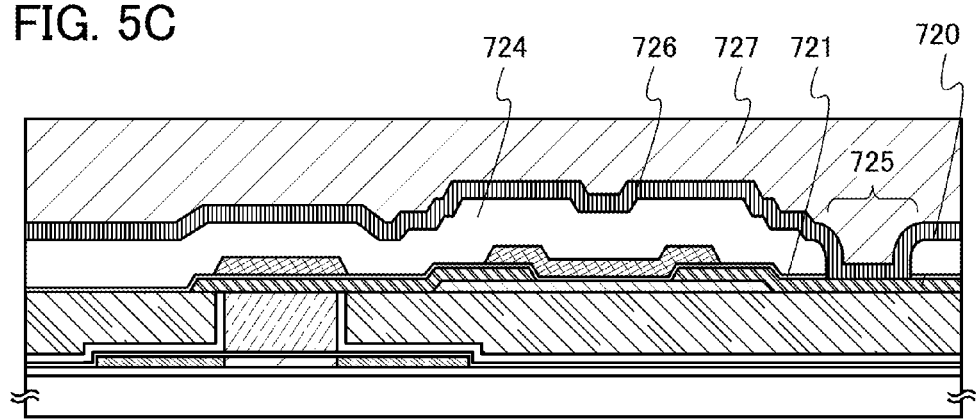

Next, as illustrated in FIG. 5C, an insulating film 724 is formed to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably employed. When the dielectric constant of the insulating film 724 is lowered, parasitic capacitance generated between wirings or electrodes can be reduced, which results in higher speed operation. Here, the insulating film 724 has a single-layer structure; alternatively, the insulating film 724 may have a stacked structure of two or more layers.

Next, an opening 725 is formed in the gate insulating film 721 and the insulating film 724, so that part of the conductive film 720 is exposed. After that, a wiring 726 that is in contact with the conductive film 720 in the opening 725 is formed over the insulating film 724.

The wiring 726 is formed in such a manner that a conductive film is formed by PVD or CVD and then processed by etching. Examples of the material of the conductive film are an element selected from aluminum, chromium, copper, tantalum, titanium, molybdenum, and tungsten and an alloy containing any of these elements as a component. One or more materials selected from manganese, magnesium, zirconium, beryllium, neodymium, and scandium may be used.

Specifically, for example, the wiring 726 can be formed in such a manner that a thin titanium film (with a thickness of about 5 nm) is formed by PVD in a region including the opening 725 of the insulating film 724 and then, an aluminum film is formed so as to fill the opening 725. Here, the titanium film formed by PVD has a function of reducing an oxide film (e.g., a natural oxide film) formed on a surface where the titanium film is formed, to decrease contact resistance with a lower electrode (here, the conductive film 720). In addition, hillock of the aluminum film can be prevented. A copper film may be formed by a plating method after the formation of the barrier film of titanium, titanium nitride, or the like.

Then, an insulating film 727 is formed to cover the wiring 726. Through the series of steps, the memory cell 100 illustrated in FIG. 2C can be formed.

Note that in the fabrication method, the conductive films 719 and 720 functioning as the source and drain electrodes are formed after the formation of the oxide semiconductor layer 716. Thus, as illustrated in FIG. 5B, in the transistor 101 obtained by the fabrication method, the conductive films 719 and 720 are formed over the oxide semiconductor layer 716. Alternatively, in the transistor 101, the conductive films functioning as the source and drain electrodes may be formed below the oxide semiconductor layer 716, that is, between the oxide semiconductor layer 716 and the insulating films 712 and 713.

Figure 6:
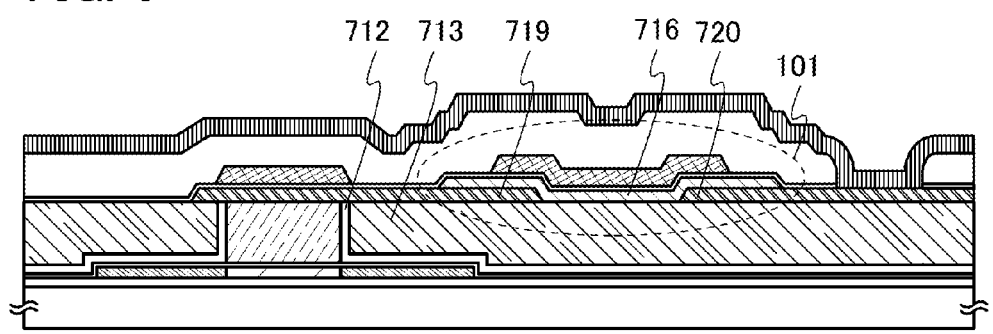
FIG. 6 is a cross-sectional view illustrating an example of the structure of a memory cell.

FIG. 6 is a cross-sectional view of the transistor 101 in which the conductive films 719 and 720 functioning as the source and drain electrodes are provided between the oxide semiconductor layer 716 and the insulating films 712 and 713. The transistor 101 illustrated in FIG. 6 can be obtained in such a manner that the conductive films 719 and 720 are formed after the formation of the insulating film 713, and then the oxide semiconductor layer 716 is formed.

<Structural Example of Logic Circuit Unit 12>

The logic circuit unit 12 includes a plurality of logic elements and wirings between the logic elements. A function of the logic circuit unit 12 can be changed by changing a function of any logic element. Moreover, a function of the logic circuit unit 12 can be changed by changing an electrical connection relation of wirings between logic elements.

The logic element is composed of a lookup table (LUT) and a multiplexer, for example. A function of the logic element can be specified by setting given configuration data in a memory element that stores data of the lookup table. Further, a function of the logic element can be specified by setting given configuration data in a memory element that stores information on selection of signals input to the multiplexer.

The wirings between the logic elements are constituted, for example, using a connection switch having a plurality of input terminals and output terminals (a connection switch that is provided between plural logic elements and other plural logic elements and determines which output signal from each of the former plural logic elements is input to any of the latter plural logic elements). The electrical connection relation of the wirings between the logic elements can be specified by setting given configuration data in a memory element that stores data on the on/off state of the connection switch.

The connection switch can be configured using any of the circuits illustrated in FIGS. 2B to 2E. For example, the connection switch can be a switch 600 illustrated in FIG. 9.

<Structural Example of Switch 600>

The switch 600 controls connection between a logic element 612 and a logic element 618 in the logic circuit unit 12. The logic element 612 illustrated in FIG. 9 includes a lookup table 613, a flip-flop 614, and an AND circuit 615. The logic element 618 in FIG. 9 includes a lookup table 619, a flip-flop 620, and an AND circuit 621.

The switch 600 is composed of a circuit having three groups each including a first transistor, a second transistor, and a third transistor. For the first transistor, a semiconductor material that has a wider band gap and lower intrinsic carrier density than silicon is used. Here, an oxide semiconductor is used for a channel formation region of the first transistor.

Meanwhile, each of the second and third transistors is preferably a transistor that uses a semiconductor material such as silicon, for example, for a channel formation region and thus can operate at higher speed than the first transistor. Here, the second and third transistors are n-channel transistors.

Figure 9:
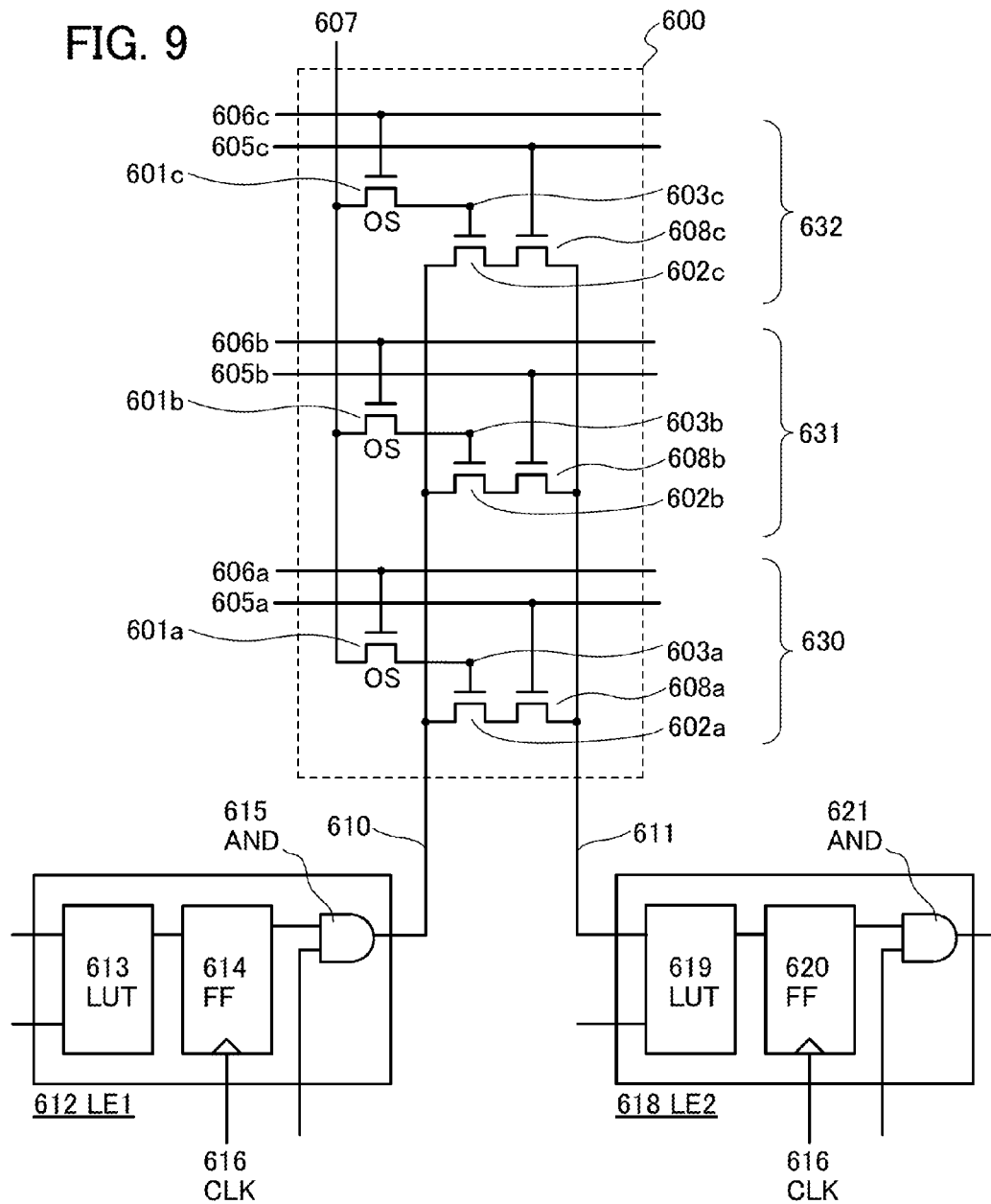
FIG. 9 is a circuit diagram illustrating an example of the structure of a logic circuit unit.

As illustrated in FIG. 9, the switch 600 specifically includes first transistors 601a, 601b, and 601c, second transistors 602a, 602b, and 602c, and third transistors 608a, 608b, and 608c. Gates of the first transistors 601a, 601b, and 601c are electrically connected to wirings 606a, 606b, and 606c, respectively. A write signal is input to the wirings 606a to 606c. Sources of the first transistors 601a to 601c are electrically connected to a common wiring 607. A write data signal is input to the wiring 607. Drains of the first transistors 601a, 601b, and 601c are electrically connected to gates of the second transistors 602a, 602b, and 602c, respectively. Drains of the second transistors 602a, 602b, and 602c are electrically connected to sources of the third transistors 608a, 608b, and 608c, respectively. Thus, the second transistors 602a, 602b, and 602c are electrically connected in series with the third transistors 608a, 608b, and 608c, respectively. Drains of the third transistors 608a to 608c are connected to each other. The sources of the second transistors 602a to 602c are electrically connected to an output terminal of the logic element 612 through a wiring 610. The drains of the third transistors 608a to 608c are electrically connected to an input terminal of the logic element 618 through a wiring 611. Here, points where the drains of the first transistors 601a, 601b, and 601c are electrically connected to the respective gates of the second transistors 602a, 602b, and 602c are respectively referred to as nodes 603a, 603b, and 603c. Configuration data can be stored at the nodes 603a to 603c.

In this manner, the switch 600 illustrated in FIG. 9 consists of three groups 630, 631, and 632 each including the first, second, and third transistors.

The logic element 612 outputs a signal to the wiring 610. Then, the signal is supplied to the wiring 611 through the switch 600 and input to the logic element 618.

When the potential of any one of the wirings 606a to 606c is set high ("H") and a potential corresponding to "H" or low ("L") is supplied to the wiring 607, charge corresponding to the potential of the wiring 607 can be stored at the selected node 603a, 603b, or 603c. Note that at this time, at least one of the wirings 610 and 611 is preferably set "L".

Here, with the use of transistors with extremely low off-state current as the first transistors 601a to 601c, the amount of charge stored at the nodes 603a to 603c can be kept constant while the wirings 606a to 606c are at "L". That is, inputted data can be stored. When the wirings 606a to 606c are set "L" and one of the wirings 605a to 605c is set "H" to turn on the third transistor 608a, 608b, or 608c corresponding to the selected node the on/off state of the switch 600 is determined by the on/off state of the second transistor 602a, 602b, or 602c corresponding to the amount of charge stored at the selected node 603a, 603b, or 603c. In other words, by selecting one of the wirings 605a to 605c, the on/off state of the switch 600 can be switched instantly in accordance with the amount of charge stored at the node 603a, the node 603b, or the node 603c.

Here, the amounts of charge accumulated at the node 603a, 603b, and 603c are stored as configuration data so that the configuration data can be switched by switching between the wirings 605a, 605b, and 605c.

Such a structure can reduce time for reading data from a memory device that stores plural pieces of configuration data. Consequently, the logic circuit unit 12 in which configuration data can be switched at high speed can be provided.

EXAMPLE 1

A semiconductor device including the programmable LSI of one embodiment of the present invention can be used for display devices, personal computers, and image reproducing devices provided with recording media (typically, devices that reproduce the content of recording media such as digital versatile discs (DVDs) and have displays for displaying the reproduced images). Other examples of a semiconductor device including the programmable LSI of one embodiment of the present invention are mobile phones, game machines including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines.

The description is made on examples where a semiconductor device including the programmable LSI of one embodiment of the present invention is applied to a portable electronic device such as a mobile phone, a smartphone, or an e-book reader.

Figure 7:
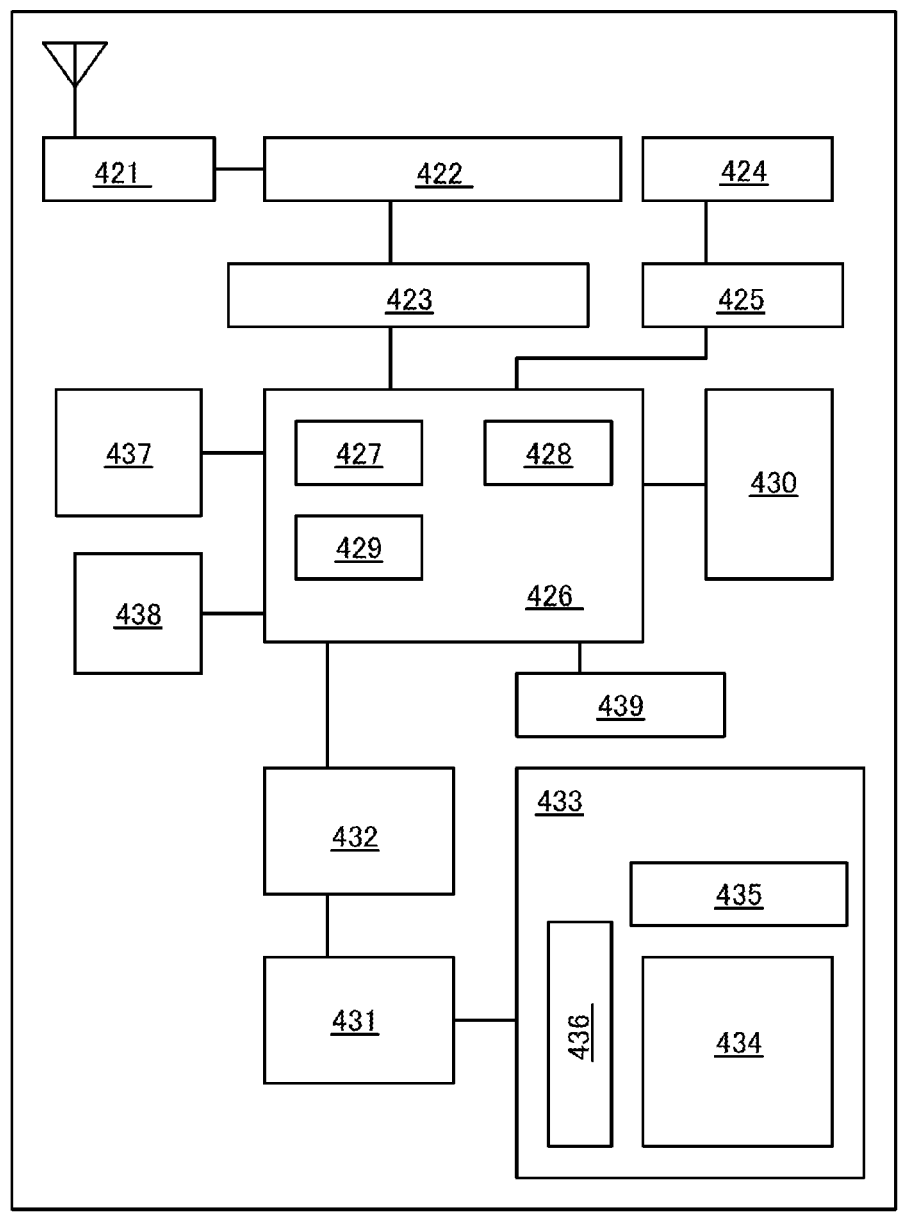
FIG. 7 is a block diagram of a portable electronic device.

FIG. 7 is a block diagram of a portable electronic device. The portable electronic device illustrated in FIG. 7 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. The use of the above-mentioned programmable LSI for the CPU 427 can achieve both suppression of operation delay and reduction in power consumption.

Figure 8:
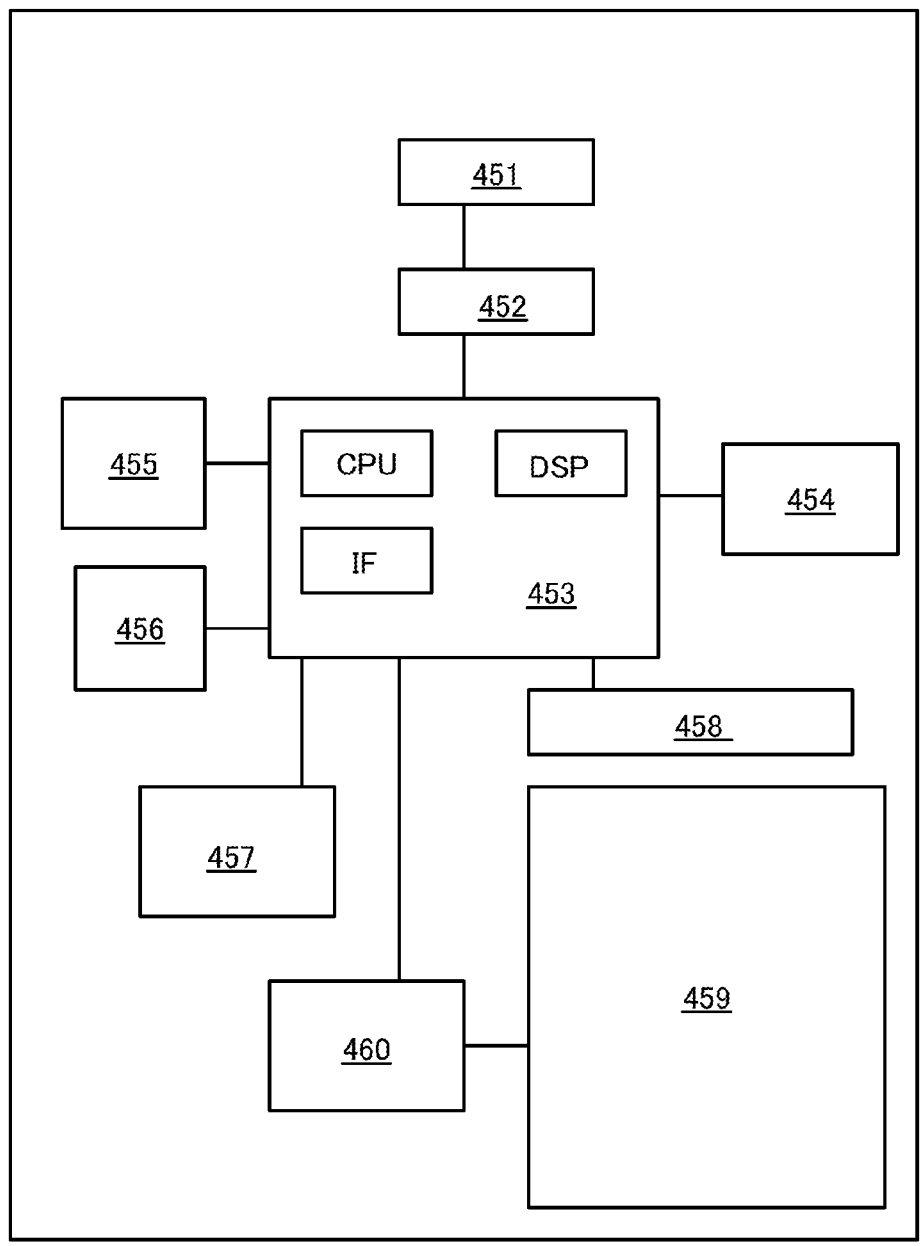
FIG. 8 is a block diagram of an e-book reader.

FIG. 8 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The use of the above programmable LSI for the microprocessor 453 can achieve both suppression of operation delay and reduction in power consumption.

This application is based on Japanese Patent Applications serial No. 2012-102014 filed with Japan Patent Office on Apr. 27, 2012, the entire contents of which are hereby incorporated by reference.

What is claimed is:
1. A semiconductor device comprising:
   a programmable large-scale integration (LSI) comprising:
      a bank group;
      a configuration memory; and
      a logic circuit unit comprising:
         a first logic element and a second logic element; and
         a switch configured to control an electrical connection between the first logic element and the second logic element, the switch comprising:
            a first group and a second group each comprising:
               a first transistor and a second transistor electrically connected in series between the first logic element and the second logic element; and a third transistor through which a gate of one of the first transistor and the second transistor is electrically connected to a first wiring, wherein the bank group is configured to store plural pieces of configuration data, and wherein a channel formation region of the third transistor comprises an oxide semiconductor.

2. The semiconductor device according to claim 1, wherein the bank group comprises a plurality of memory cells, and wherein each of the plurality of memory cells comprises an input bit line, an output bit line, an input word line, an output word line, a reference potential line, a fourth transistor, a fifth transistor, and a sixth transistor.

3. The semiconductor device according to claim 2, wherein the fourth transistor comprises a gate electrically connected to the input word line, and a source and a drain one of which is electrically connected to the input bit line, wherein the fifth transistor comprises a gate electrically connected to the other of the source and the drain of the fourth transistor, and a source and a drain one of which is electrically connected to the reference potential line, and wherein the sixth transistor comprises a gate electrically connected to the output word line, and a source and a drain one of which is electrically connected to the other of the source and the drain of the fifth transistor and the other of which is electrically connected to the output bit line.

4. The semiconductor device according to claim 2, further comprising a capacitor, wherein the fourth transistor comprises a gate electrically connected to the input word line, and a source and a drain one of which is electrically connected to the input bit line, wherein the fifth transistor comprises a gate electrically connected to the other of the source and the drain of the fourth transistor and one of a pair of electrodes of the capacitor, and a source and a drain one of which is electrically connected to the reference potential line, and wherein the sixth transistor comprises a gate electrically connected to the output word line, and a source and a drain one of which is electrically connected to the other of the source and the drain of the fifth transistor and the other of which is electrically connected to the output bit line.

5. The semiconductor device according to claim 2, wherein the fourth transistor comprises a gate electrically connected to the input word line, and a source and a drain one of which is electrically connected to the input bit line, wherein the fifth transistor comprises a gate electrically connected to the output word line, and a source and a drain one of which is electrically connected to the reference potential line, and wherein the sixth transistor comprises a gate electrically connected to the other of the source and the drain of the fourth transistor, and a source and a drain one of which is electrically connected to the other of the source and the drain of the fifth transistor and the other of which is electrically connected to the output bit line.

6. The semiconductor device according to claim 2, further comprising a capacitor, wherein the fourth transistor comprises a gate electrically connected to the input word line, and a source and a drain one of which is electrically connected to the input bit line, wherein the fifth transistor comprises a gate electrically connected to the output word line, and a source and a drain one of which is electrically connected to the reference potential line, and wherein the sixth transistor comprises a gate electrically connected to the other of the source and the drain of the fourth transistor and one of a pair of electrodes of the capacitor, and a source and a drain one of which is electrically connected to the other of the source and the drain of the fifth transistor and the other of which is electrically connected to the output bit line.

7. The semiconductor device according to claim 2, wherein at least one of the fourth transistor, the fifth transistor, and the sixth transistor comprises an oxide semiconductor layer having a channel.

8. The semiconductor device according to claim 2, wherein each of the plurality of memory cells is configured to store multi-level data.

9. A semiconductor device comprising:
 a programmable large-scale integration (LSI) comprising:
  a bank group which is rewritable and configured to store plural pieces of configuration data
  a configuration memory; and
  a logic circuit unit comprising:
   a first logic element and a second logic element; and
   a switch configured to control an electrical connection between the first logic element and the second logic element, the switch comprising:
    a first group and a second group each comprising:
     a first transistor and a second transistor electrically connected in series between the first logic element and the second logic element; and
     a third transistor through which a gate of one of the first transistor and the second transistor is electrically connected to a first wiring, wherein a channel formation region of the third transistor comprises an oxide semiconductor.

10. The semiconductor device according to claim 9, wherein the bank group comprises a plurality of memory cells, and wherein each of the plurality of memory cells comprises an input bit line, an output bit line, an input word line, an output word line, a reference potential line, a fourth transistor, a fifth transistor, and a sixth transistor.

11. The semiconductor device according to claim 10 wherein the fourth transistor comprises a gate electrically connected to the input word line, and a source and a drain one of which is electrically connected to the input bit line, wherein the fifth transistor comprises a gate electrically connected to the other of the source and the drain of the fourth transistor, and a source and a drain one of which is electrically connected to the reference potential line, and wherein the sixth transistor comprises a gate electrically connected to the output word line, and a source and a drain one of which is electrically connected to the other of the source and the drain of the fifth transistor and the other of which is electrically connected to the output bit line.

12. The semiconductor device according to claim 10, further comprising a capacitor, wherein the fourth transistor comprises a gate electrically connected to the input word line, and a source and a drain one of which is electrically connected to the input bit line, wherein the fifth transistor comprises a gate electrically connected to the other of the source and the drain of the fourth transistor and one of a pair of electrodes of the capacitor, and a source and a drain one of which is electrically connected to the reference potential line, and wherein the sixth transistor comprises a gate electrically connected to the output word line, and a source and a drain one of which is electrically connected to the other of the source and the drain of the fifth transistor and the other of which is electrically connected to the output bit line.

13. The semiconductor device according to claim 10,
wherein the fourth transistor comprises a gate electrically connected to the input word line, and a source and a drain one of which is electrically connected to the input bit line, wherein the fifth transistor comprises a gate electrically connected to the output word line, and a source and a drain one of which is electrically connected to the reference potential line, and wherein the sixth transistor comprises a gate electrically connected to the other of the source and the drain of the fourth transistor, and a source and a drain one of which is electrically connected to the other of the source and the drain of the fifth transistor and the other of which is electrically connected to the output bit line.

14. The semiconductor device according to claim 10, further comprising a capacitor,
wherein the fourth transistor comprises a gate electrically connected to the input word line, and a source and a drain one of which is electrically connected to the input bit line, wherein the fifth transistor comprises a gate electrically connected to the output word line, and a source and a drain one of which is electrically connected to the reference potential line, and wherein the sixth transistor comprises a gate electrically connected to the other of the source and the drain of the fourth transistor and one of a pair of electrodes of the capacitor, and a source and a drain one of which is electrically connected to the other of the source and the drain of the fifth transistor and the other of which is electrically connected to the output bit line.

15. The semiconductor device according to claim 10, wherein at least one of the fourth transistor, the fifth transistor, and the sixth transistor comprises an oxide semiconductor layer having a channel.

16. The semiconductor device according to claim 10, wherein each of the plurality of memory cells is configured to store multi-level data.

17. A driving method for a semiconductor device, the semiconductor device comprising:
a programmable large-scale integration (LSI) comprising:
a bank group comprising a first bank and a second bank;
a configuration memory; and
a logic circuit unit comprising:
a first logic element and a second logic element; and
a switch configured to control an electrical connection between the first logic element and the second logic element, the switch comprising:
a first group and a second group each comprising:
a first transistor and a second transistor electrically connected in series between the first logic element and the second logic element; and
a third transistor through which a gate of one of the first transistor and the second transistor is electrically connected to a first wiring,
wherein a channel formation region of the third transistor comprises an oxide semiconductor,
the method comprising:
writing a first configuration data into the first bank while the logic circuit unit is configured according to a second configuration data stored in the second bank.

18. The driving method according to claim 17,
wherein the bank group comprises a plurality of memory cells, and
wherein each of the plurality of memory cells comprises an input bit line, an output bit line, an input word line, an output word line, a reference potential line, a fourth transistor, a fifth transistor, and a sixth transistor.

19. The driving method according to claim 18,
wherein the fourth transistor comprises a gate electrically connected to the input word line, and a source and a drain one of which is electrically connected to the input bit line, wherein the fifth transistor comprises a gate electrically connected to the other of the source and the drain of the fourth transistor, and a source and a drain one of which is electrically connected to the reference potential line, and wherein the sixth transistor comprises a gate electrically connected to the output word line, and a source and a drain one of which is electrically connected to the other of the source and the drain of the fifth transistor and the other of which is electrically connected to the output bit line.

20. The driving method according to claim 18,
wherein the semiconductor device further comprises a capacitor,
wherein the fourth transistor comprises a gate electrically connected to the input word line, and a source and a drain one of which is electrically connected to the input bit line, wherein the fifth transistor comprises a gate electrically connected to the other of the source and the drain of the fourth transistor and one of a pair of electrodes of the capacitor, and a source and a drain one of which is electrically connected to the reference potential line, and wherein the sixth transistor comprises a gate electrically connected to the output word line, and a source and a drain one of which is electrically connected to the other of the source and the drain of the fifth transistor and the other of which is electrically connected to the output bit line.

21. The driving method according to claim 18,
wherein the fourth transistor comprises a gate electrically connected to the input word line, and a source and a drain one of which is electrically connected to the input bit line, wherein the fifth transistor comprises a gate electrically connected to the output word line, and a source and a drain one of which is electrically connected to the reference potential line, and wherein the sixth transistor comprises a gate electrically connected to the other of the source and the drain of the fourth transistor, and a source and a drain one of which is electrically connected to the other of the source and the drain of the fifth transistor and the other of which is electrically connected to the output bit line.

22. The driving method according to claim 18,
wherein the semiconductor device further comprises a capacitor,
wherein the fourth transistor comprises a gate electrically connected to the input word line, and a source and a drain one of which is electrically connected to the input bit line,
wherein the fifth transistor comprises a gate electrically connected to the output word line, and a source and a drain one of which is electrically connected to the reference potential line, and
wherein the sixth transistor comprises a gate electrically connected to the other of the source and the drain of the fourth transistor and one of a pair of electrodes of the capacitor, and a source and a drain one of which is electrically connected to the other of the source and the drain of the fifth transistor and the other of which is electrically connected to the output bit line.

23. The driving method according to claim 18, wherein at least one of the fourth transistor, the fifth transistor, and the sixth transistor comprises an oxide semiconductor layer having a channel.

24. The driving method according to claim 18, wherein each of the plurality of memory cells is configured to store multi-level data.

\* \* \* \* \*